United States Patent
Ghosh et al.

(10) Patent No.: US 7,119,434 B1
(45) Date of Patent: Oct. 10, 2006

(54) EFFICIENCY CPU COOLING ARRANGEMENT

(75) Inventors: Debashis Ghosh, Amherst, NY (US); Mohinder Singh Bhatti, Amherst, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/174,903

(22) Filed: Jul. 5, 2005

(51) Int. Cl.
*H01L 23/10* (2006.01)

(52) U.S. Cl. .................. 257/707; 257/706; 257/720; 257/E23.101; 257/E23.11

(58) Field of Classification Search ............... 257/706, 257/707, 712, 720, E23.101, E23.11
See application file for complete search history.

(56) References Cited

U.S. PATENT DOCUMENTS

2004/0238946 A1* 12/2004 Tachibana et al. .......... 257/706

OTHER PUBLICATIONS

Charles A. Harper, Electronic Packaging and Interconnection Handbook, 2000, The McGraw-Hill Companies, Inc., Third Edition, pp. 2.36-2.37.*

Anon., Intel Pentium 4 Processor with 512-KB L2 Cache on 0.13 Micron Process Thermal Design Guidelines, Document No. 252161-001, pp. 18 & 25, Nov. 2002.

Anon., Intel 82801 EB I/O Controller Hub 5 (ICH5) and Intel 82801 ER I/O Controller Hub 5 R (ICH5R), Document No. 252673-001, p. 14, Apr. 2003.

C.K. Loh et al, Thermal Characterization of Fan-Heat Sink Systems in Miniature Axial Fan and Micro Blower Airflow, Seventeenth IEE Semi-Therm Symposium, pp. 111-116, Seventeenth Annual IEEE Semi-Therm Symposium, San Jose, CA, Mar. 20-22, 2001.

C.W. Yu et al, Thermal Design of a Desktop System Using CFD Analysis, pp. 18-26, Seventeenth Annual IEEE Semi-Therm Symposium, San Jose, CA, Mar. 20-22, 2001.

B.A. Occhionero et al, Enhanced Thermal Management AlSiC Microprocessor Lids., Ceramic Process Systems, Chartley, MA 02712.

* cited by examiner

*Primary Examiner*—Minh-Loan Tran
(74) *Attorney, Agent, or Firm*—Patrick M. Griffin

(57) ABSTRACT

A CPU cooling assembly having a first, covering layer of conductive material above the upper surface of an enclosed, heat producing chip and a third, upper layer of conductive material (a heat sink base plate) thermally bonded to the first by an intermediate, second layer of thin, conforming material (thermal grease) that is far less thermally conductive, and more resistive, than the other two layers. The relative thickness relationship of the first and third, more conductive, layers is essentially reversed from the prior art, with first layer being relatively thicker than the third. This creates an overall lower resistance for the three layer sandwich.

3 Claims, 2 Drawing Sheets

EFFICIENCY CPU COOLING ARRANGEMENT

TECHNICAL FIELD

This invention relates to electronics cooling in general, and specifically to a more efficient arrangement of components for cooling a computer chip or the like.

BACKGROUND OF THE INVENTION

Semiconductor chips are continually increasing in power, compactness and waste heat production. While they must be consequently cooled, for a number of reasons, this is generally not done by directly cooling the chip with a forced stream of cooling fluid or liquid. The surface area of the chip is small, and in order to contact that small surface with a sufficient and effective volume of coolant, the flow rate would be high, and chip surface might be eroded or damaged. Instead, as best seen in FIG. 2, computer chip makers typically protectively package semiconductor chips within a module, called a central processing unit or CPU. Chip 10, basically a layered silicon wafer, has a lower surface on which a so called ball grid array is disposed, sealed to a substrate 12 with a layer of sealant material 14. I/O connectors 16 extend through the substrate 12, and these are later connected to the circuit boards of a computer are other device by the manufacturer. Encapsulating the perimeter and upper surface of the chip 10 is a so called integrated heat sink 18 of conductive metal, typically copper or copper based alloy, which is formed around the chip 10 and bonded to the top surface by a conductive epoxy material layer 20. Epoxy 20 creates a permanent conductive bond to reduce thermal resistance, as well as providing a mechanical bond. The upper surface 22 of the heat sink 18 is highly polished and flattened, and generally protected with nickel plating. While the integrated heat sink upper surface 22 is larger than the surface of chip 10, even it alone does not provide sufficient conductive surface area.

As seen in FIG. 2, the end user of the CPU unit connects the I/O connectors 16 to a circuit board 23, and also bonds the upper surface 22 to the undersurface of a spreader plate 24 through a layer of compliant, thermally conductive "grease" 26. The upper surface of spreader plate 24 is covered with fins 28 or similar structures, across which a fluid is pumped to extract heat by forced convection. The overall structure of fins 28 and spreader plate 24 together are often referred to also as a heat sink. Here, however, to avoid confusion, just the spreader plate 24 and its particular thickness will be referred to in detail.

As seen in FIG. 3, the most significant portions of the CPU and the cooling mechanism may be schematically shown. Only the chip 10, epoxy layer 20, the upper thickness of the integrated heat sink 18 (that thickness located between the epoxy layer 20 and the upper surface 22), the thermal grease layer 26, and the spreader plate 24 are shown. Each layer in the three layer path, by virtue of its own inherent material properties, will have a pre determined thermal conductivity (conversely, resistivity), which, for a certain thickness of that material, will yield a certain thermal conductance (conversely, resistance). A layer twice as thick, all other things being equal, will have twice the thermal resistance, although its inherent resistivity does not change. While they are two sides of the same coin, the term thermal resistance will be used most often. The thermal grease layer 26 is almost negligibly thick, approximately 0.08 mm, but its thermal resistance (° F.-minute/BTU or ° C./Watt) is large, as compared to the metal layers above and below it, which have an inherently lower thermal resistivity and resultant lower thermal resistance. Together, the three thicknesses above the chip epoxy layer 20, in order, the upper layer of the integrated heat sink 18, the thermal grease layer 26, and the spreader plate 24, represent a three layer conductive path (conversely, resistive path) which the extracted heat must traverse. These are indicated at $\delta_1$, $\delta_2$ and $\delta_3$, for a total thickness $\delta t$. Conventional wisdom makes the first thickness $\delta_1$ as small as possible to enhance the outflow of heat, since, for any given material, the conductive resistance will be directly proportional to its thickness. Typical $\delta_1$ thicknesses run from 1.0 to 1.5 mm, with 1.5 mm being depicted in FIG. 3. $\delta_2$, as mentioned, is very small, and dictated by considerations not typically within the control of the final assembler. $\delta_3$ will be dictated to a certain degree by heat spreading, manufacturing and weight considerations, being thick enough for robustness, but not so thick as to be overly heavy or expensive. Six mm is a typical thickness. The total conductive path thickness, will be somewhat limited by packaging considerations, as well. The total thermal resistance across the three layer path is, of course, the sum of the three resistances. So far as is known, no one has considered the three thicknesses as they relate to each other in a scientific way to determine what the best and most effective relative thickness proportions are, beyond the expressed desire to make $\delta_1$ as thin as possible. This "thinner is better" prejudice on the part of the CPU makers typically results in $\delta_1$ being significantly less than half of the total conductive path thickness, once the conventional $\delta_2$ and $\delta_3$ have been added, as indicated in FIG. 3.

SUMMARY OF THE INVENTION

The subject invention has found an unexpected advantage in both increasing the absolute thickness of the first element in the three-layer conductive path outlined above, and increasing its thickness relative to the third element in the conductive path, contrary to previous teachings. The overall thermal resistance of the total conductive path can be significantly reduced, and cooling efficiency enhanced.

DESCRIPTION OF THE PREFERRED EMBODIMENT

Figure 1:
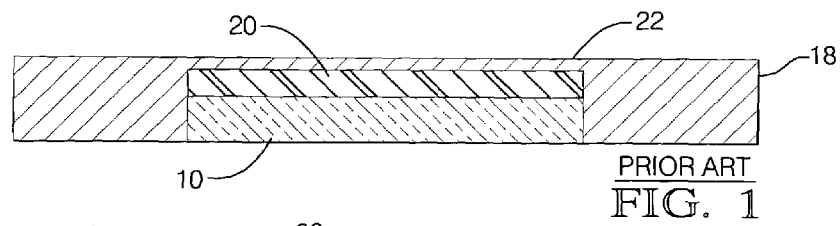
FIG. 1 is a cross section of a typical CPU, showing its various components and relative thicknesses.
Figure 2:
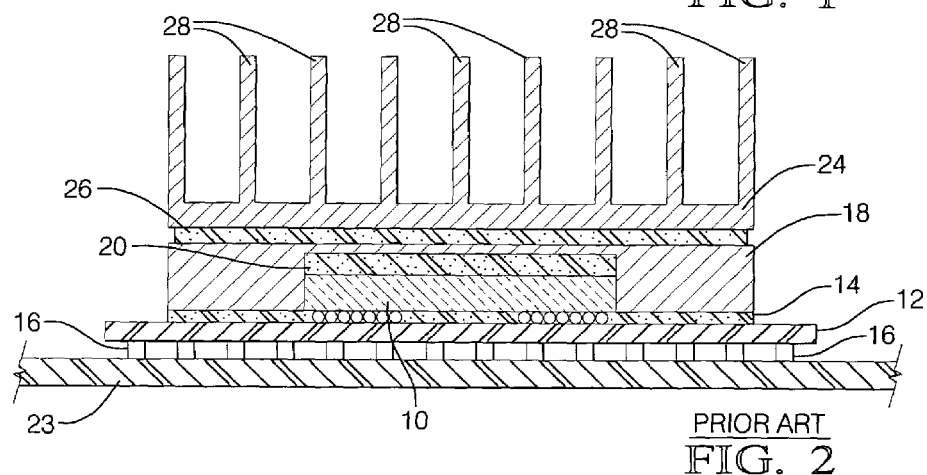
FIG. 2 is a cross section of a typical CPU mounted to a circuit board with a heat spreader and fins.
Figure 3:
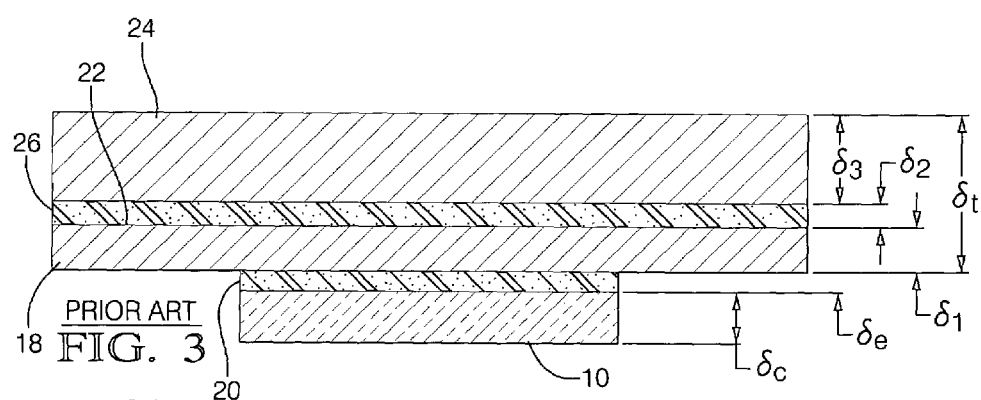
FIG. 3 is a schematic view showing the relative thicknesses of the three conductive layers above the upper surface of the chip in a conventional CPU and spreader plate.
Figure 4:
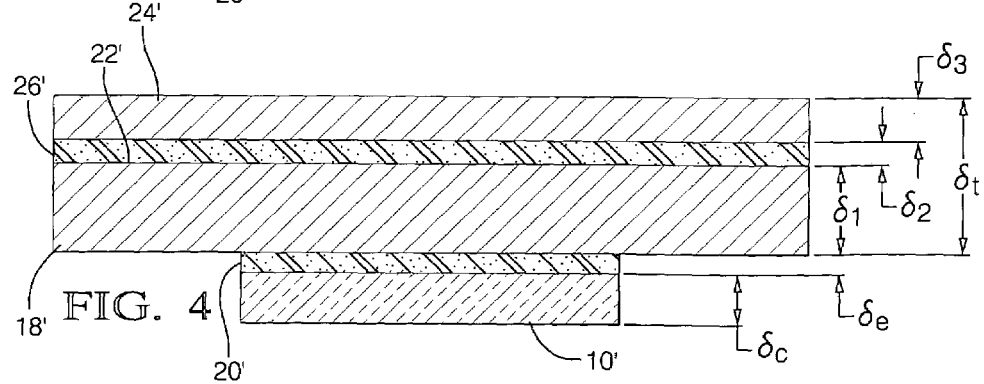
FIG. 4 is a view like FIG. 3, but showing the relative thicknesses of the same layers according to an embodiment of the invention.

Referring first to FIG. 4, an embodiment of the present invention, in a view similar to FIG. 3, can be briefly and simply described. Since the various components are similar (and can be identical as to material), they are given the same numbers with a prime. Some more detail on the actual CPU that was simulated and tested will be given. The material for both integrated heat sink 18' and spreader plate 24' are copper, with a conductivity of approximately 300 W/(° C.-meter). That is a high conductivity, but the thermal resistance of any material is proportional to its thickness. The integrated heat sink 18' differs in that both its absolute and relative thickness $\delta_1$ is significantly greater than that shown in FIG. 3 for prior art integrated heat sink 18, 5.0 mm as shown, as opposed to 1.5 mm. This is a large increase, and all other things being equal, increasing that thickness would be expected to proportionately increase resistance. Hence the prejudice in favor of making it thin, as noted above. The grease layer 26' is a commercially available thermal grease or paste, and its thermal conductivity is far lower, around 3 W/(° C.-meter). Its thickness, $\delta_2$, is the same, approximately 0.08 mm, far less than either of the other layers in the path, and that protocol remains the same. Conversely, the thermal resistance of the intermediate layer 26' is far higher than that of the other two. The grease layer 26' contributes less to the overall resistance when it is thinnest, but in can be made only so thin. The spreader plate 24' is made thinner, both relatively and absolutely, at 2.5 mm.

Figure 5:
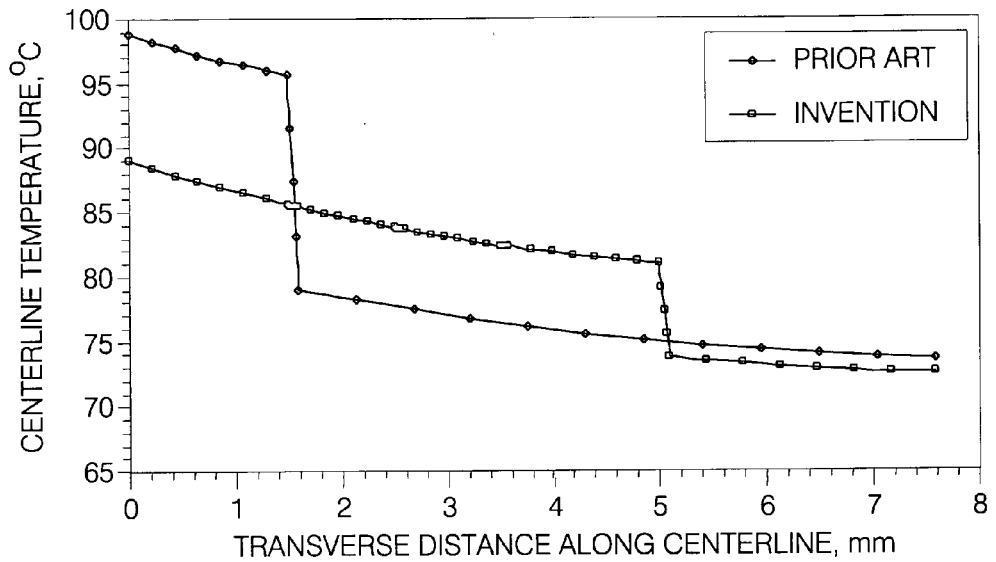
FIG. 5 is a graph showing the temperature variation along the three-layer path shown in FIGS. 3 and 4.

Referring next to FIG. 5, using various proprietary equations and computer modeling techniques, a simulated test comparing the performance of both the FIGS. 3 and 4 conductive paths was run, and the comparative results graphed (labeled prior art and invention to distinguish). It was assumed that the chip 10 was approximately 40 by 40 mm square, the integrated heat sink surface 40 by 40 mm square, and the spreader plate 60 by 60 mm square. The chip 10 was assumed to put out 256 watts of waste heat, of which 80% is concentrated in the 15 by 15 area, which means that the heat flux is much higher directly over chip 10. Temperature was plotted at the centerline, the hottest spot. The Y axis of the graph shows the centerline temperature in degrees C., and the X axis indicates the distance from just above the epoxy layer 20 (just above the chip 10) up to the spreader plate upper surface, 24 and 24'. The goal is to achieve the lowest possible steady state temperature at the zero point of the X axis, that is, just above chip 10. If chip 10 runs cooler, for a given rate of waste heat extraction, it is faster running, less stressed and longer lasting. The temperature at the rightward most point of the X axis, just at the upper surface of spreader plate 24', will be close to the ambient temperature of whatever fluid is being used to cool the plate 24'. Any arrangement will end up at that final temperature, or close to it, inevitably. Efficiency and success of the system is a function of the starting point, that is, how low is the steady state temperature that is achieved just above the surface of the chip 10. As is very evident in FIG. 5, the steady state temperature, for the invention is significantly lower, almost 10° C. lower. Also, the temperature drop at the grease layer is greater and more precipitous for the prior art arrangement. This in spite of the fact that the thickness $\delta_1$ is increased significantly, more than doubled as compared to the prior art embodiment shown in FIG. 3. Increasing the thickness of an element per se proportionately increases its particular thermal resistance, and it is highly counterintuitive that doing so would actually decrease the overall thermal resistance of the three-layer path.

Figure 6:
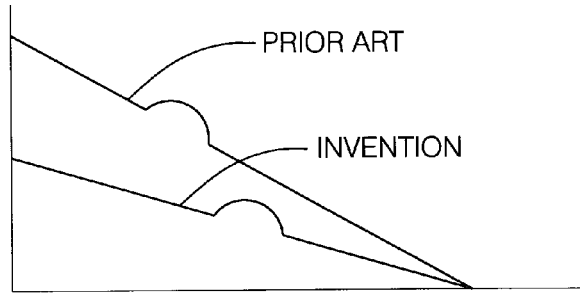
FIG. 6 is a drawing depicting an analogy illustrating the difference in operation of the arrangements shown in FIGS. 3 and 4.

Referring next to FIG. 6, with the virtue of hind sight, an analogy suggests itself that may help to understand, or at least to visualize, this apparent paradox. Two potential paths down a ski slope are posited, one labeled "prior art" and one labeled "invention," although these terms should be understood to be illustrative only. Neither axis is labeled or is intended to represent actual units of any quantity but the distance up the Y axis can be understood as representing a skier's starting height on a ski slope, and the steepness of the line represents the steepness of the slope. That initial starting height, in turn, is analogous to the steady state temperature just over the chip. The ending point, the bottom of the slope, is the same for each skier, they finish up there inevitably, just as the ambient temperature at the heat spreader upper surface will inevitably be very close to the ambient temperature of whatever fluid is being blown or pumped over it. In addition to just getting to the bottom, each skier has to get over a severe "bump" on the slope, the height of which is analogous to the relatively high thermal resistance of the thermal grease layer. Getting to the finishing point per se, then, is not an issue. Rather, getting there efficiently is, and efficiency is a function of the path taken, and how high up the skier had to start to get over the bump and to the bottom. The first skier starts out on an initially steep slope (analogous to a thin first layer in the three layer path with a consequently low resistance), and he hits the bump first, while he's going fast. The impact is jarring and inefficient. He makes it over the bump, but not smoothly. This is analogous to the precipitous temperature drop in FIG. 5. He then has a shallower and longer slope to the bottom. The second skier starts out from a lower point, and with a shallower, longer slope, and hits the bump later. He's not going as fast, but fast enough to get over it, which he does less jarringly, more efficiently. This is analogous to the much lower temperature drop in FIG. 5, at the grease layer. He has less slope left after having passed the bump, but still has enough speed left to get to the bottom. So, counter-intuitively, being faster out of the gate was not the way to "win" this race, after all. Analogously, a thinner first layer in the three layer path was not more efficient, contrary to expectations.

Figure 7:
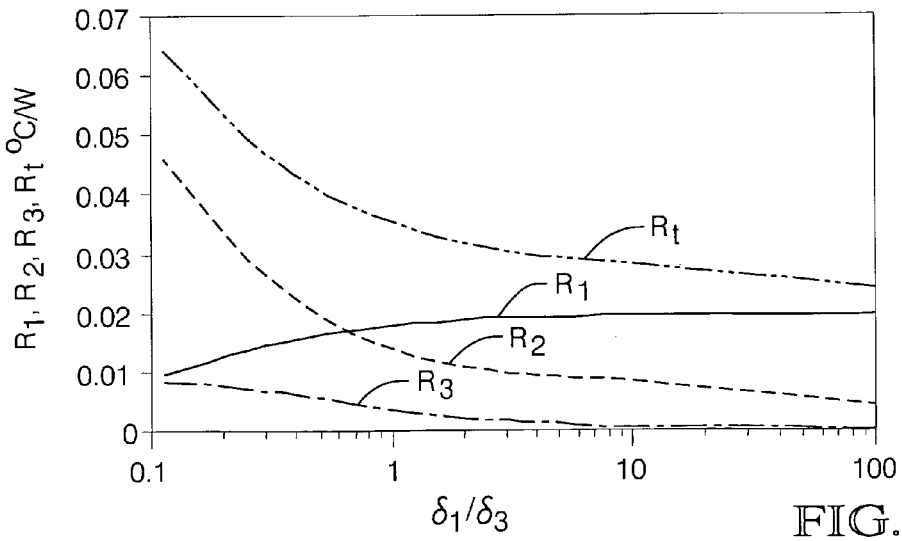
FIG. 7 is a graph showing how the total resistance of the three layer path changes for various relative thicknesses of the layers

FIG. 7 is a graph showing the performance of other possible combinations of various layer thicknesses, with the individual resistance of each layer labeled $R_1$, $R_2$ and $R_3$ on the Y axis, and the total resistance $R_t$ being the sum of the three. The X axis indicates the ratio of the first layer thickness $\delta_1$ to the third layer thickness $\delta_3$. In each case, the material properties were the same as for the FIG. 3 and FIG. 4 arrangements above, with a total thickness $\delta_t$ of 7.5 mm, and constant thickness $\delta_2$ of 0.08 mm for the intermediate grease layer (almost negligible to the total thickness, despite its much higher resistance). Only the relative thicknesses of the first and third layers were varied. The teaching of the prior art was that $\delta_1$ should be as thin as possible, and therefore, relatively thinner than $\delta_3$, a ratio less than unity. The invention shows that a ratio of $\delta_1$ to $\delta_3$ greater than unity (1.0) actually provides the lowest overall resistance R. Preferably, as can also be seen from FIG. 7, that ratio would fall in the 1.0 to 10.0 range, with diminishing returns above the 10.0 range.

The invention claimed is:

1. In a CPU cooling assembly having a heat producing chip with an upper surface, a first layer of conductive material of thickness $\delta_1$ and having a pre determined thermal conductivity thermally bonded to the chip upper surface and also having an upper surface, a third layer of conductive material of thickness $\delta_3$ having a comparable conductivity to the first layer and having a lower surface, and a second layer of compliant conductive material of relatively small but fixed thickness $\delta_2$ and relatively high, fixed and controlling thermal resistance as compared to the other two layers, with a total conductive path thickness $\delta_t$ equal to the sum of $\delta_1$ $\delta_2$, and $\delta_3$, the improvement comprising, the ratio of the $\delta_1$ thickness to the $\delta_3$ thickness being greater than 1.0.

2. The CPU cooling assembly according to claim 1, in which the ratio of the $\delta_1$ thickness to the $\delta_3$ thickness is greater than 1.0 and not greater than 10.0.

3. The CPU cooling assembly according to claim 1, in which the first and third layers of conductive material have substantially the same conductivity.

* * * * *